(12) United States Patent
Zhou

(10) Patent No.: US 11,729,977 B2
(45) Date of Patent: Aug. 15, 2023

(54) MULTI-DIVISION STAIRCASE STRUCTURE OF THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventor: Yuting Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 188 days.

(21) Appl. No.: 17/382,277

(22) Filed: Jul. 21, 2021

(65) Prior Publication Data

US 2021/0351200 A1 Nov. 11, 2021

Related U.S. Application Data

(60) Division of application No. 16/861,793, filed on Apr. 29, 2020, now Pat. No. 11,244,957, which is a
(Continued)

(51) Int. Cl.
*H01L 27/11582* (2017.01)
*H10B 43/27* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC .................................. H10B 43/27; H10B 43/20
See application file for complete search history.

(56) References Cited

U.S. PATENT DOCUMENTS 10,049,744 B2 8/2018 Jeong et al.
2009/0230462 A1 9/2009 Tanaka et al.
(Continued)

FOREIGN PATENT DOCUMENTS

CN 107039457 A 8/2017
CN 200903738 A 4/2018
(Continued)

OTHER PUBLICATIONS

International Search Report issued in corresponding International Application No. PCT/CN2020/075458, dated Nov. 19, 2020, 5 pages.

*Primary Examiner* — Christopher A Johnson
(74) *Attorney, Agent, or Firm* — Bayes PLLC

(57) ABSTRACT

A method for forming a staircase structure of a memory device includes the following operations. A first number of divisions are formed at different depths along a first direction in a stack structure and a trench structure between adjacent divisions, the stack structure comprising interleaved sacrificial material layers and dielectric material layers. A plurality of stairs are formed along a second direction. Each of the plurality of stairs includes the first number of divisions, and each of the divisions includes a first number of sacrificial portions. The second direction is perpendicular to the first direction. An insulating portion is formed in the trench structure. A top sacrificial portion is formed on a top surface of each of the first number of divisions and in contact with the insulating portion. The top sacrificial portion is replaced with a conductor portion through a slit structure in the insulating portion and in contact with the top sacrificial portion.

16 Claims, 11 Drawing Sheets

Related U.S. Application Data continuation of application No. PCT/CN2020/075458, filed on Feb. 17, 2020.

(51) Int. Cl.
*H10B 41/10* (2023.01)
*H10B 41/27* (2023.01)
*H10B 41/35* (2023.01)
*H10B 43/10* (2023.01)
*H10B 43/35* (2023.01)

(56) References Cited

U.S. PATENT DOCUMENTS

| | | |
|---|---|---|
| 2017/0200676 A1* | 7/2017 | Jeong .................... H10B 41/35 |
| 2018/0240811 A1 | 8/2018 | Kim et al. |
| 2019/0221574 A1 | 7/2019 | Shimabukuro et al. |

FOREIGN PATENT DOCUMENTS

| CN | 108461502 A | 8/2018 |
|---|---|---|
| CN | 110400807 A | 11/2019 |
| CN | 110770902 A | 2/2020 |
| CN | 110770903 A | 2/2020 |
| TW | 200903738 A | 1/2009 |

\* cited by examiner

MULTI-DIVISION STAIRCASE STRUCTURE OF THREE-DIMENSIONAL MEMORY DEVICE AND METHOD FOR FORMING THE SAME

CROSS-REFERENCE TO RELATED APPLICATIONS

This application is a divisional of U.S. application Ser. No. 16/861,793, filed on Apr. 29, 2020, entitled "MULTI-DIVISION STAIRCASE STRUCTURE OF THREE-DIMENSIONAL MEMORY DEVICE AND METHOD FOR FORMING THE SAME," which is a continuation of International Application No. PCT/CN2020/075458, filed on Feb. 17, 2020, entitled "MULTI-DIVISION STAIRCASE STRUCTURE OF THREE-DIMENSIONAL MEMORY DEVICE AND METHOD FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of a multi-division staircase structure of a 3D memory device and method for forming the 3D memory device are disclosed herein.

In one example, a memory device includes a memory array structure and a staircase structure. The staircase structure includes a plurality of stairs each has a first number of divisions at different depths along a first direction. The plurality of stairs extend along a second direction perpendicular to the first direction. Each of the first number of divisions of a respective stair includes a conductor portion on the top surface of the respective division and a second number of non-conductor portions under the conductor portion. The conductor portion and the non-conductor portions are insulated from one another by one or more dielectric layers.

In another example, a memory device includes a memory array structure and a staircase structure. The staircase structure includes a plurality of stairs each includes a first number of divisions at different depths along a first direction, the plurality of stairs extending along a second direction perpendicular to the first direction. The staircase structure also includes an insulating portion between adjacent divisions. A depth of the insulating portion along a vertical direction is about a thickness of the respective stair. Of the insulation portion, a portion of a bottom surface in a lower adjacent division is lower than a portion of the bottom surface in a higher adjacent division.

In a further example, a method for forming a staircase structure of a memory device includes the following operations. First, a first number of divisions are formed at different depths along a first direction in a stack structure and a trench structure between adjacent divisions, the stack structure comprising interleaved sacrificial material layers and dielectric material layers. A plurality of stairs are formed along a second direction. Each of the plurality of stairs includes the first number of divisions, and each of the divisions includes a first number of sacrificial portions. The second direction is perpendicular to the first direction. An insulating portion is formed in the trench structure. A top sacrificial portion is formed on a top surface of each of the first number of divisions and in contact with the insulating portion. The top sacrificial portion is replaced with a conductor portion through a slit structure in the insulating portion and in contact with the top sacrificial portion.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
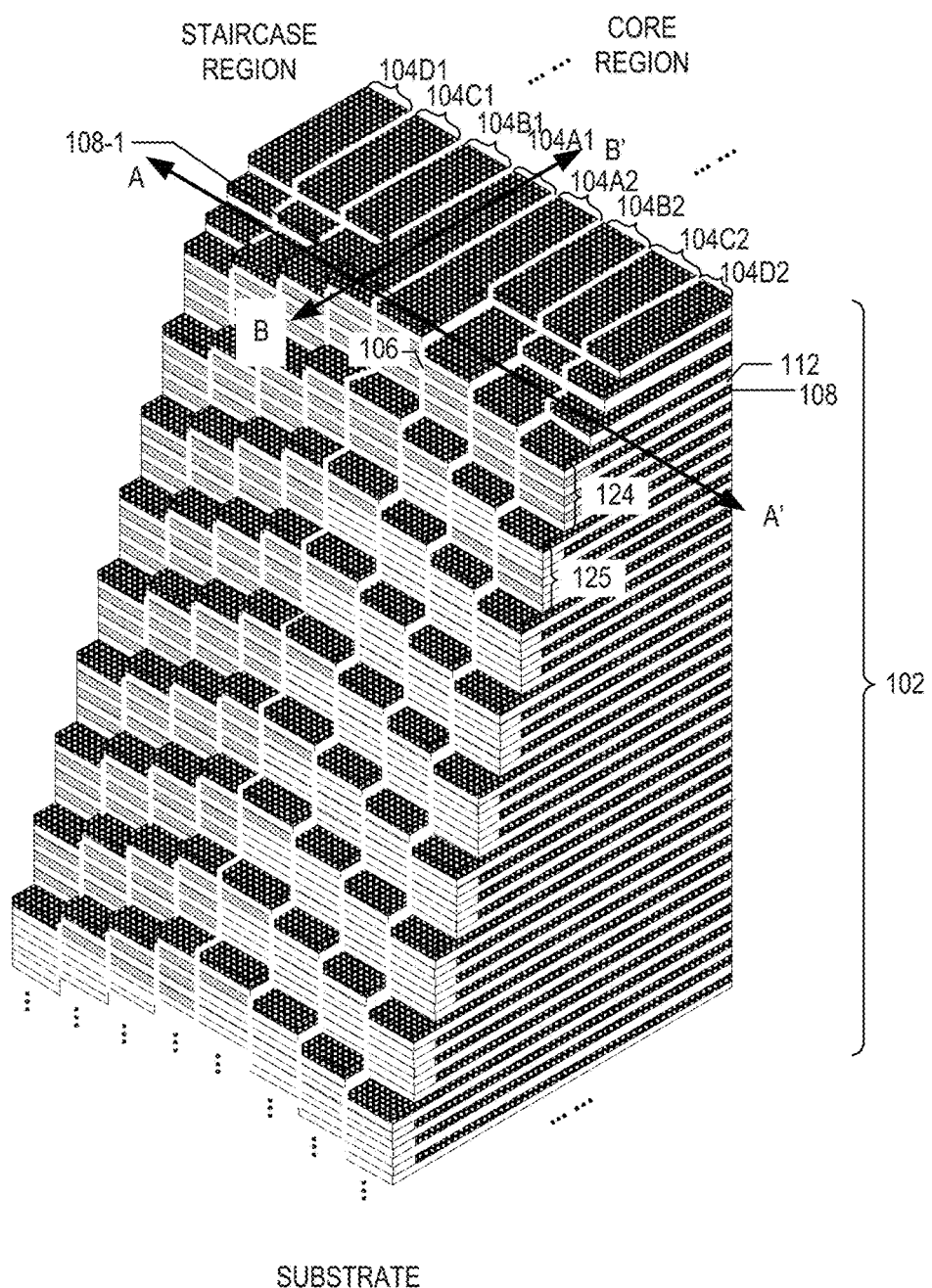
FIG. 1A illustrates an exemplary 3D memory device having a staircase structure, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides of the stacked storage structure for purposes such as word line fan-out. As the demand for higher storage capacity continues to increase, the number of vertical levels of the stacked storage structure also increases. Multi-division staircase structures have been used in some 3D NAND memory devices in which each stair (level) of the staircase structure can have multiple divisions for fan-out multiple word lines using the same stair, thereby reducing the interconnect layout complexity and increasing the utilization of the staircase structure.

During the fabrication of the multi-division staircase structures, word line via contacts are formed on the stairs for fan-out purposes. The word line via contacts are often formed by forming openings in contact with the stairs (e.g., the landing area of the stairs) in the insulating structure in which the staircase structure is placed, and filling the openings with a conductive material. Conventionally, these openings, formed to be in contact with stairs at different depths/heights, are formed in the same etching process. Because of the variation in opening depths, the openings are often not etched evenly or desirably. For example, the openings in contact with lower stairs (e.g., the deeper openings) and the openings in contact with higher stairs (e.g., the shallower openings) undergo the same etching time, resulting the openings in contact with the higher stairs to be over etched. The over-etching can cause the top conductor layers (e.g., word lines) on the top surfaces of the higher stairs to be undesirably damaged or even etched through. The word line via contacts can undesirably be in contact with the conductor layers underlying the top conductor layers, causing short circuits in the respective divisions.

Various embodiments in accordance with the present disclosure provide structures and methods for forming a multi-division staircase structure of a 3D memory device. The multi-divisional staircase structure includes a plurality of divisions at different depths along a first direction, and a plurality of stairs extending along a second direction that is perpendicular to the first direction. Each stair includes the plurality of divisions. In some embodiments, each division includes a top conductor portion and at least one non-conductor portion under the top conductor layer. The top conductor portion and the at least one non-conductor portion are separated from each other by a dielectric portion in between. The top conductor portion may in contact with a conductor layer (e.g., word line) extending laterally in the staircase structure. In some embodiments, the number of the at least one non-conductor portion is equal to the number of divisions minus one. Adjacent non-conductor portions are separated from each other by a dielectric portion. The width of each non-conductor layer along the first direction is the same as that of the division, and the length of each non-conductor layer along the second direction is the same as that of the division (or the respective stair). In some embodiments, a word line via contact is formed to be in contact with the top conductor portion, and the at least one non-conductor portions under the respective conductor portion may prevent any over-etching to the top conductor portion (e.g., for the formation of the opening to form the word line via contact) to cause short circuits in the 3D memory device. That is, even if the top conductor portion is damaged and/or etched through, the non-conductor portions under the top conductor portion can prevent the conductive material of the word line via contact from contacting/interfering with other conductive structures (e.g., top conductor portions of other divisions and/or neighboring conductor layers). In some embodiments, the non-conductor portions include silicon nitride.

In some embodiments, the staircase structure includes an insulating portion between adjacent divisions. A contact structure electrically connected to the array common source (ACS) of the 3D memory device extends through the insulating portion. The contact structure is in contact with the top conductor portion in the higher division and isolated from the non-conductor portions in adjacent divisions. The contact structure is also in contact with conductor layers that are laterally in contact with the non-conductor portions and conductor layers under the non-conductor portions in adjacent divisions. In some embodiments, the insulating portion is formed for the formation of the non-conductor portions and the conductor portion in each division. Specifically, the insulating portion prevents the non-conductor portions in each division from being replaced by the conductor material during the gate-replacement process. The non-conductor portions can thus be retained under the respective conductor portion in the 3D memory device and prevent undesirable contact between the respective word line via contact and neighboring conductive structures (e.g., other conductor layers). The length of the insulating portion along the second direction is the same as that of the respective division (or the respective stair), and the width of the insulating portion along the first direction is greater than that of the contact structure. The depth of the insulating portion along a vertical direction (e.g., the z-axis) is sufficient for the formation of the plurality of non-conductor portions in adjacent divisions. In some embodiments, the depth is nominally equal to the thickness of the respective stair.

Figure 1B:
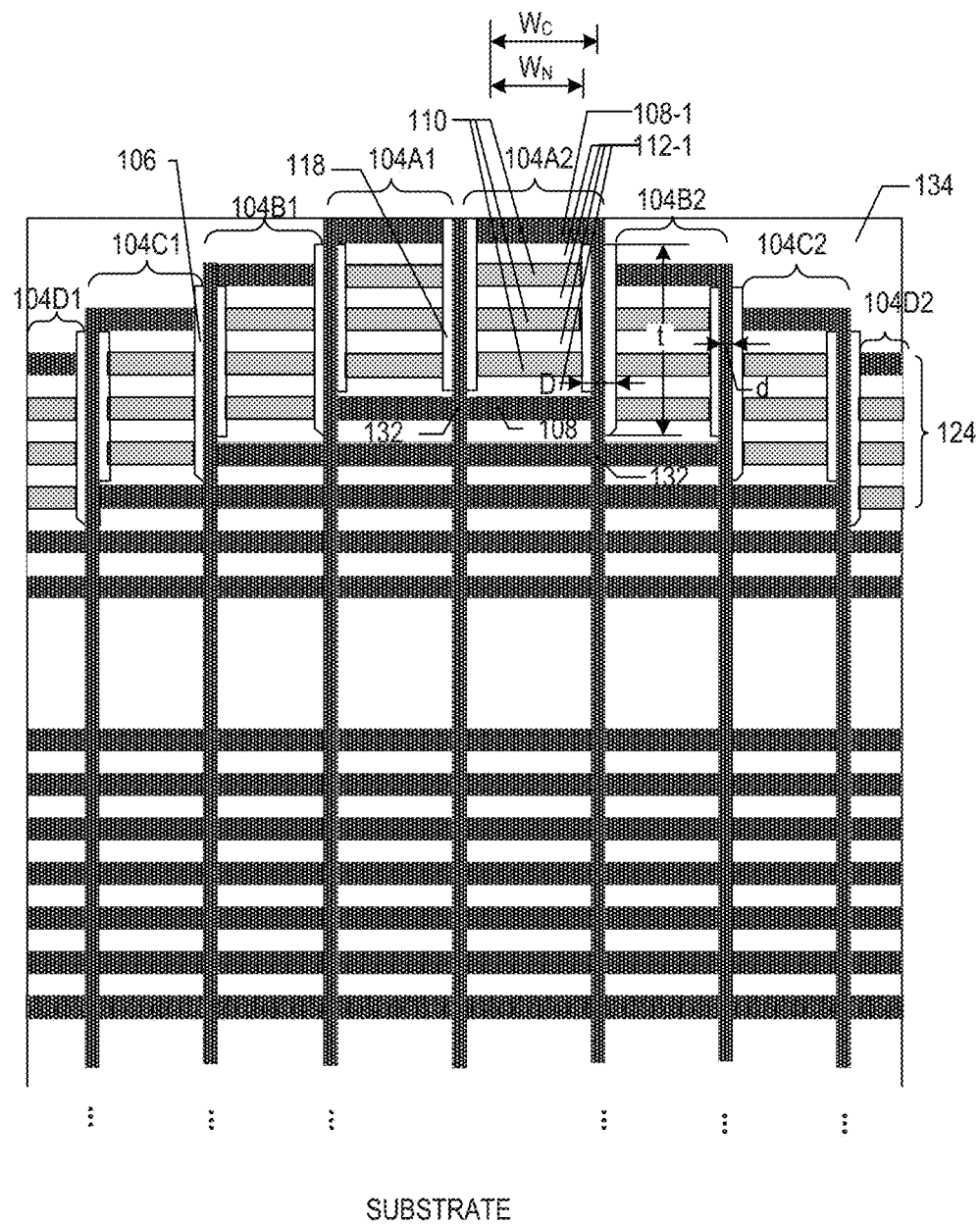
FIG. 1B illustrates a cross-sectional view of the 3D memory device shown in FIG. 1A, according to some embodiments of the present disclosure.
Figure 1C:
FIG. 1C illustrates another cross-sectional view of the 3D memory device shown in FIG. 1A, according to some embodiments of the present disclosure.

FIGS. 1A, 1B, and 1C illustrate an exemplary multi-division staircase structure of a 3D memory device, according to some embodiments. FIG. 1A is a 3D overview of the 3D memory device, FIG. 1B is a cross-sectional view of the 3D memory device along the A-A' direction (e.g., the x-z plane), and FIG. 1C is a cross-sectional view of the 3D memory device along the B-B' direction (e.g., the y-z plane). FIGS. 1A, 1B, and 1C are described together in the present disclosure. For ease of illustration, in the present disclosure, a four-division staircase structure is depicted and described. It should be noted that the staircase structure can have any suitable number of divisions. For example, the number of divisions can be 2, 3, 4, 5, N, etc., where N representing a suitable positive integer. The structure and method provided in this disclosure can be employed to form a multi-division 3D memory device with any suitable number of divisions. The specific number of divisions should not be limited by the embodiments of the present disclosure.

FIG. 1A illustrates an overview of an exemplary 3D memory device 100 having a staircase structure 102, according to some embodiments of the present disclosure. 3D memory device 100 can include a core region ("CORE REGION") in the center and one or more staircase structures 102 at the outer sides (e.g., located in "STAIRCASE REGION"). A memory array structure, in which a plurality of memory cells are formed, is located in the core region. In some embodiments, the 3D memory device is a NAND Flash memory device in which the memory cells are provided in the form of an array of NAND memory strings (not shown) in the memory array structure. The memory array structure can include any other suitable components including, but not limited to, gate line slits (GLSs), through array contacts (TACs), array common sources (ACSs), etc.

It is noted that x and y axes are included in FIGS. 1A-1C to illustrate two orthogonal directions in the wafer plane. In some embodiments, the x-direction is the bit line direction of 3D memory device 100, and the y-direction is the word line direction of 3D memory device 100. Staircase structure 102 can be either a functional staircase structure used for landing interconnects (e.g., word line via contacts) and/or dummy channel holes or a dummy staircase structure used for balancing load in etching or chemical mechanical polishing (CMP) processes during fabrication. The vertical direction is represented by the z-axis/direction, which is perpendicular to both x and y axes.

As shown in FIGS. 1A and 1B, staircase structure 102 may include a four-division staircase structure which includes four divisions at different depths along the x-axis in each stair of staircase structure 102. Staircase structure 102 may also include a plurality of stairs extending along the y-axis. Staircase structure 102 may include four divisions at different depths in each stair: 104A1, 104B1, 104C1, and 104D1 arranged on one side of a stair 124. In some embodiments, staircase structure 102 may include four other divisions in each stair: 104A2, 104B2, 104C2, and 104D2 arranged on the other side of stair 124. In some embodiments, divisions 104A1 and 104A2, 104B1 and 104B2, 104C1 and 104C2, 104D1 and 104D2 are arranged symmetrically about a middle line of stair 124. In some embodiments, the middle line divides (e.g., evenly divides) the respective stair (e.g., 124) into two portions (e.g., identical portions), each having the four divisions at different depths. In some embodiments, divisions 104A1 and 104A2, 104B1 and 104B2, 104C1 and 104C2, 104D1 and 104D2 may respectively have the same shape, depth, dimensions, and/or depth in a respective stair. It should be noted that, in some embodiments, the two divisions that are symmetrically distributed about the middle line of the stair and having the same depth are referred to as one division. However, for ease of description, in the present disclosure, a division refers to the portion of a stair that is only on a single side of the middle line of the stair. Because of the symmetry of the divisions in a stair, the structure and formation of the divisions on one side of the stair can also be applied to those of the corresponding symmetrical divisions on the other side of the stair. In some embodiments, the number of stairs in the x-direction is equal to or greater than 64, such as 64, 96, 128, 160, 192, 224, 256, etc. For ease of depiction, only a portion of staircase structure 102 is shown in FIGS. 1A-1C. Staircase structure 102 and the memory array structure may be formed over a substrate ("SUBSTRATE"), which can include silicon (e.g., single crystalline silicon), silicon germanium (SiGe), gallium arsenide (GaAs), germanium (Ge), silicon on insulator (SOI), or any other suitable materials.

As shown in FIGS. 1A-1C, staircase structure 102 includes a plurality of conductor layers 108 and a plurality of dielectric layers 112 interleaved along the vertical direction (e.g., the z-axis). In some embodiments, conductor layers 108 and dielectric layers 112 extend laterally in staircase structure 102 and into the core region. Conductor layers 108 can include conductive materials including, but not limited to, tungsten (W), cobalt (Co), copper (Cu), aluminum (Al), polycrystalline silicon (polysilicon), doped silicon, silicides, or any combination thereof. Dielectric layers 112 can include dielectric materials including, but not limited to, silicon oxide, silicon nitride, silicon oxynitride, or any combination thereof. In some embodiments, conductor layers 108 include metals, such as tungsten, and dielectric layers 112 include silicon oxide. Along the z-axis, the thicknesses of conductor layers 108 and dielectric layers 112 may be the same or different.

In some embodiments, staircase structure 102 includes four divisions 104A1, 104B1, 104C1, and 104D1 at different depths arranged along the x-axis on one side of the respective stair, and another four divisions 104A2, 104B2, 104C2, and 104D2 at different depths arranged symmetrically along the x-axis on the other side of the respective stair. In some embodiments, stairs in the same division extend along the y-axis. A contact structure 132, conductively connected to the ACS of 3D memory device 100, may be positioned between adjacent divisions. For ease of depiction, contact structures 132 are not shown in FIGS. 1A and 1C, but shown in FIG. 1B. In some embodiments, contact structure 132 extends vertically into the substrate and laterally into the core region. Contact structure 132 may include an insulating spacer and a contact extending in the insulating spacer. The insulating spacer may include dielectric materials including, but not limited to, silicon oxide, silicon nitride, silicon oxynitride, or any combination thereof. The contact may include conductive materials including, but not limited to, tungsten, cobalt, copper, aluminum, polysilicon, doped silicon, silicides, or any combination thereof. In some embodiments, 3D memory device 100 includes an insulating structure 134 (shown only in FIG. 1B for ease of depiction) in which staircase structure 102 is positioned. Insulating structure 134 may include dielectric materials including, but not limited to, silicon oxide, silicon nitride, silicon oxynitride, or any combination thereof.

For ease of illustration, the details of staircase structure 102 is further described in view of two consecutive stairs 124 and 125 shown in FIGS. 1A-1C. Each stair (e.g., 124 or 125) may include four divisions 104A1, 104B1, 104C1, and 104D1 at different depths arranged along the x-axis on one side of the respective stair, and another four divisions 104A2, 104B2, 104C2, and 104D2 at different depths arranged symmetrically along the x-axis on the other side of the respective stair. An insulating portion 106 may be positioned between adjacent divisions of each stair (e.g., 124 or 125). Contact structure 132 may extend through insulating portion 106. In some embodiments, another insulating portion (e.g., 118), aligned with the middle line of the respective stair (e.g., 124), is positioned between divisions 104A1 and 104A2.

In each division, staircase structure 102 may include a conductor portion (e.g., a top conductor portion) at the top surface and functioning as the landing area for word line via contacts, and a non-conductor structure under the respective conductor portion. For example, in division 104A2 of stair 124, a conductor portion 108-1 is positioned on the top surface and a non-conductor structure 114 is positioned under conductor portion 108-1. Conductor portion 108-1 and non-conductor structure 114 may be insulated from each other by a dielectric portion 112-1. In each division, each conductor portion 108-1 is in contact with a respective conductor layer 108 extending from the staircase region to the core region, and each dielectric portion 112-1 is in contact with a respective dielectric layer 112 extending from the staircase region to the core region. In some embodiments, dielectric portions 112-2 include the same material(s) as dielectric layers 112.

In some embodiments, each division includes a conductor portion 108-1 in contact with a respective conductor layer 108. Conductor portion 108-1 and conductor layer 108 may include the same material(s). Non-conductor structure 114 may include a plurality of non-conductor portions 110 arranged under the respective conductor portion 108-1. In some embodiments, non-conductor structure 114 includes the same number of non-conductor portions 110 and dielectric portions 112-1, interleaved with one another along the z-axis. In some embodiments, along the x-axis, a width $W_C$ of conductor portion 108-1 is equal to or greater than a width $W_N$ of non-conductor structure 114. In some embodiments, $W_C$ is greater than $W_N$ along the x-axis. In some embodiments, along the x-axis, widths of all non-conductor portions 110 are nominally the same and equal to $W_N$. In some embodiments, along the y-axis, a length of conductor portion 108-1 is nominally equal to a length of non-conductor structure 114. The length L may be nominally equal to a length of the respective stair (e.g., 124 or 125). In some embodiments, the width (along the x-axis) and the length (along the y-axis) of dielectric portion 112-1 are nominally the same as those of non-conductor portions 110.

In some embodiments, in each division, a number non-conductor portions 110 (e.g., 3) is equal to a number of divisions (e.g., 4). For example, the number of divisions may be any suitable positive integer such as 2, 3, 4, 5, . . . , etc., and the number of non-conductor portions in each division of a respective stair (e.g., 124 or 125) may be 1, 2, 3, 4, . . . etc. The number of divisions is referred to as the first number, and the number of non-conductor portions 110 is referred to as the second number. Non-conductor portions 110 may include any suitable dielectric material that is different from dielectric portions 112-1 (or dielectric layers 112). In some embodiments, non-conductor portions 110 includes silicon nitride (SiN). The thickness of non-conductor portion 110 may be the same as or different from the thickness of dielectric portions 112-1. In some embodiments, each non-conductor portion 110 is in contact with a conductor layer 108 that extends on the same level. That is, non-conductor structure 114 (or non-conductor portions 110) may be in contact with a second number of conductor layers 108, each being on the same level with the respective non-conductor portion 110. Similarly, non-conductor structure 114 may be in contact with a second number of dielectric layers 112, each being on the same level with the respective dielectric portion 112-1.

Insulating portion 106 may be located between adjacent divisions, e.g., between divisions 104A2 and 104B2, 104A1 and 104B1, etc. In some embodiments, along the x-axis, a width D of insulating portion 106 is greater than a width d of a respective contact structure. In some embodiments, D is sufficiently large to prevent contact between contact structure 132 and adjacent non-conductor portions 110. In some embodiments, D is in a range of about 200 nm to about 400 nm, and d is in a range of about 120 nm to about 160 nm. In some embodiments, along the vertical direction, a depth t of insulating portion 106 is about (or at least equal to) the thickness of the respective stair (e.g., 124). A top surface of insulating portion 106 may be in contact with the bottom surface of conductor portion 108-1 in the higher division. A bottom surface of insulating portion 106 may be in contact with (e.g., extending into) dielectric portions 112-1 immediately under the bottom non-conductor portions 110 in adjacent divisions. For example, thickness t of insulating portion 106 between divisions 104A2 and 104B2 is equal to or greater than a thickness of stair 124 in division 104B2. That is, thickness t of insulating portion 106 between divisions 104A2 and 104B2 may be at least a total thickness from the top surface of conductor portion 108-1 to the bottom surface of the bottom non-conductor portions 110 in division 104B2 (e.g., the lower division). In some embodiments, the top surface of insulating portion 106 extends above the top surface of conductor portion 108-1 in division 104B2 (e.g., the lower division). In some embodiments, the top surface of insulating portion 106 is in contact with the bottom surface of conductor portion 108-1 in division 104A2 (e.g., the higher division). The bottom surface of insulating portion 106 may be in contact with dielectric portions 112-1 immediately under the bottom non-conductor portion 110 in divisions 104A2 and 104B2. In some embodiments, along the y-axis, a length of insulating portion 106 is nominally equal to L. In some embodiments, of the bottom surface of insulating portion 106, the portion in the higher division (e.g., 104A2) is higher than the portion in the portion in the lower division (e.g., 104B2).

As shown in FIGS. 1A-1C, except for contact structure 132 between divisions 104A1 and 104A2 (e.g., two divisions of equal depth), each contact structure 132 is in contact with conductor portion 108-1 of a higher division. In some embodiments, contact structure 132 has no contact with non-conductor portions 110 of each of the adjacent divisions. For example, contact structure 132 between divisions 104A2 and 104B2 is in contact with conductor portion 108-1 of division 104A2, and has no contact with non-conductor portions 110 in divisions 104A2 and 104B2. In some embodiments, each contact structure 132 is in contact with a plurality of conductor layers 108 under the respective insulating portion 106 (or under the respective adjacent divisions). For example, contact structure 132 between divisions 104A2 and 104B2 is in contact with conductor layers 108 under divisions 104A2 and 104B2, and contact structure 132 between divisions 104B2 and 104C2 is in contact with conductor layers 108 under divisions 104C2 and 104B2.

In some embodiments, in the same division, conductor portion 108-1 of a lower stair is in contact with and conductively connected to conductor layer 108 immediately under non-conductor structure 114 of a higher stair. For example, as shown in FIG. 1B, in division 104A2, conductor layer 108 immediately under non-conductor structure 114 (or the bottom dielectric layer 112 of non-conductor structure 114) in stair 124 is in contact with and conductively connected to conductor portion 108-1 in stair 125. In some embodiments, in each division, the three conductor layer 108 immediately under conductor layer 108 are in contact with the respective non-conductor portions 110 in the respective stair. For example, in division 104A2, the three conductor layers 108 immediately under conductor layer 108 are respectively in contact with the three non-conductor portions 110 in stair 125.

In some embodiments, 3D memory device 100 includes another insulating portion 118 between divisions 104A1 and 104A2. In some embodiments, a top surface of insulating portion 118 is nominally coplanar with top surfaces of conductor portions 108-1 of divisions 104A1 and 104A2, and a bottom surface of insulating portion 118 is at least in contact with dielectric layers 112 under the bottom non-conductor portions 110 in divisions 104A1 and 104A2. In some embodiments, a depth of insulating portion 118 is less than or equal to the thickness of stair 124. In some embodiments, a width of insulating portion 118 along the x-axis and a length of insulating portion 118 along the second direction are similar or the same as insulating portion 106. In various embodiments, the thicknesses of insulating portions 106 and 118 vary, depending on the fabrication process. For example, the depths of insulating portions 106 and 118 can be greater than, equal to, or less than the thickness of the respective stair. As described earlier, in each stair, the depths insulating portions 106 and 118 can be any suitable value to form a second number of non-conductor portions 110 to be formed under the respective conductor portion 108-1 in adjacent divisions.

In some embodiments, contact structure 132 extends through insulating portion 118, between divisions 104A1 and 104A2, and is in contact with and conductively connected to conductor layers 108 in divisions 104A1 and 104A2 of a lower stair (e.g., stair 125). In some embodiments, as shown in FIG. 1B, contact structure 132 between two adjacent divisions is in contact with any conductor layers 108 under the two adjacent divisions of the respective stair. In some embodiments, in each stair, contact structure 132 between the two adjacent divisions is in contact with a first number of conductor layers 108 in contact with each of the adjacent divisions. For example, as shown in FIGS. 1A-1C, in stair 124, contact structure 132 between adjacent divisions 104A2 and 104B2 are in contact with conductor layers 108 that are in contact with conductor portion 108-1 and the three (e.g., the second number of) non-conductor portions 110 in each of divisions 104A2 and 104B2.

Figure 3A:
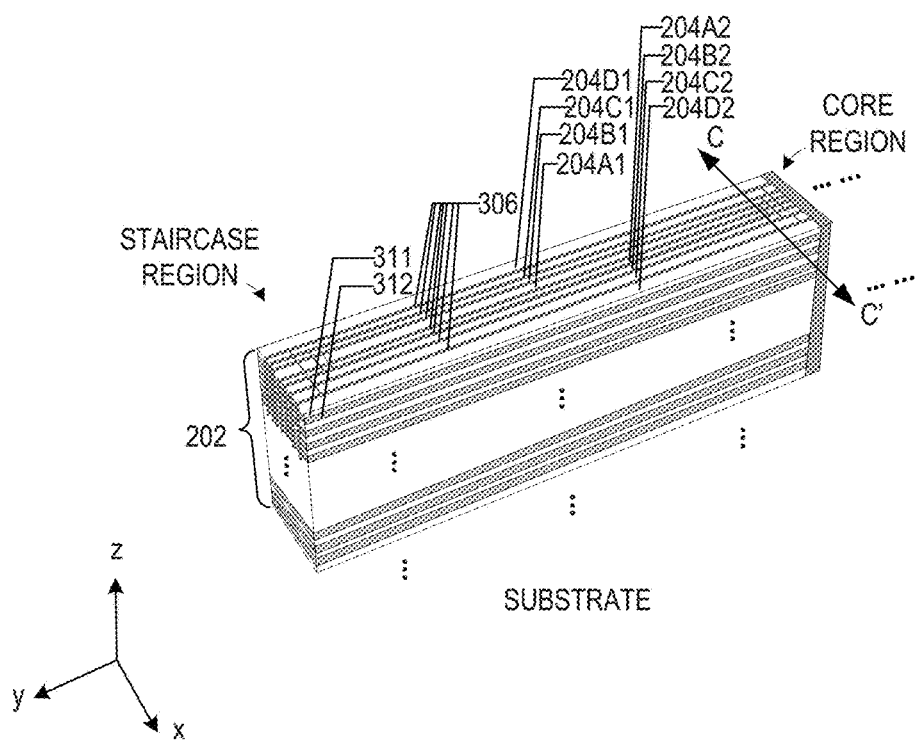
FIG. 3A illustrates another top front view of the 3D memory device in the exemplary fabrication process, according to some embodiments of the present disclosure.
Figure 3B:
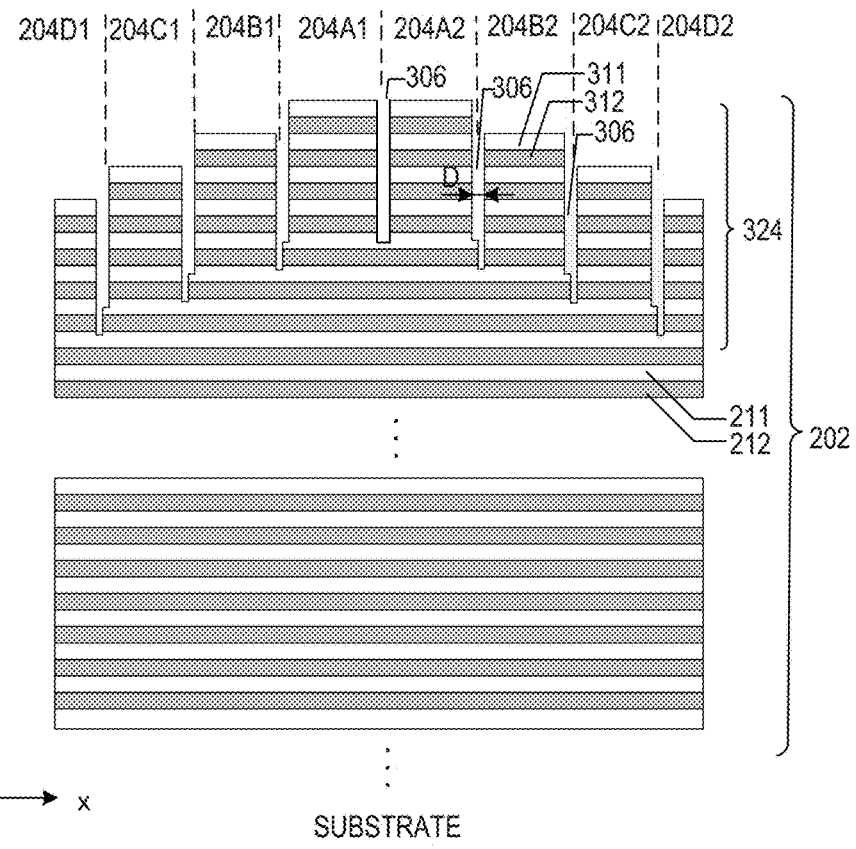
FIG. 3B illustrates a cross-sectional view of the 3D memory device shown in FIG. 3A, according to some embodiments of the present disclosure.
Figure 4A:
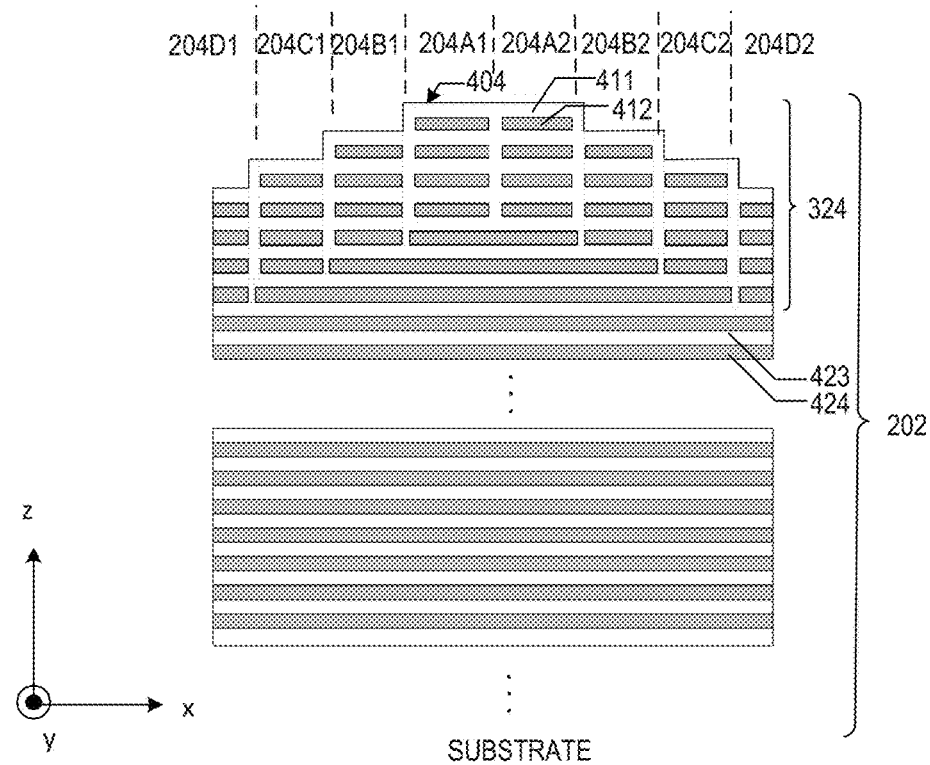
FIGS. 4A-4F each illustrates another cross-sectional view of the 3D memory device in the exemplary fabrication process, according to some embodiments of the present disclosure.
Figure 4B:
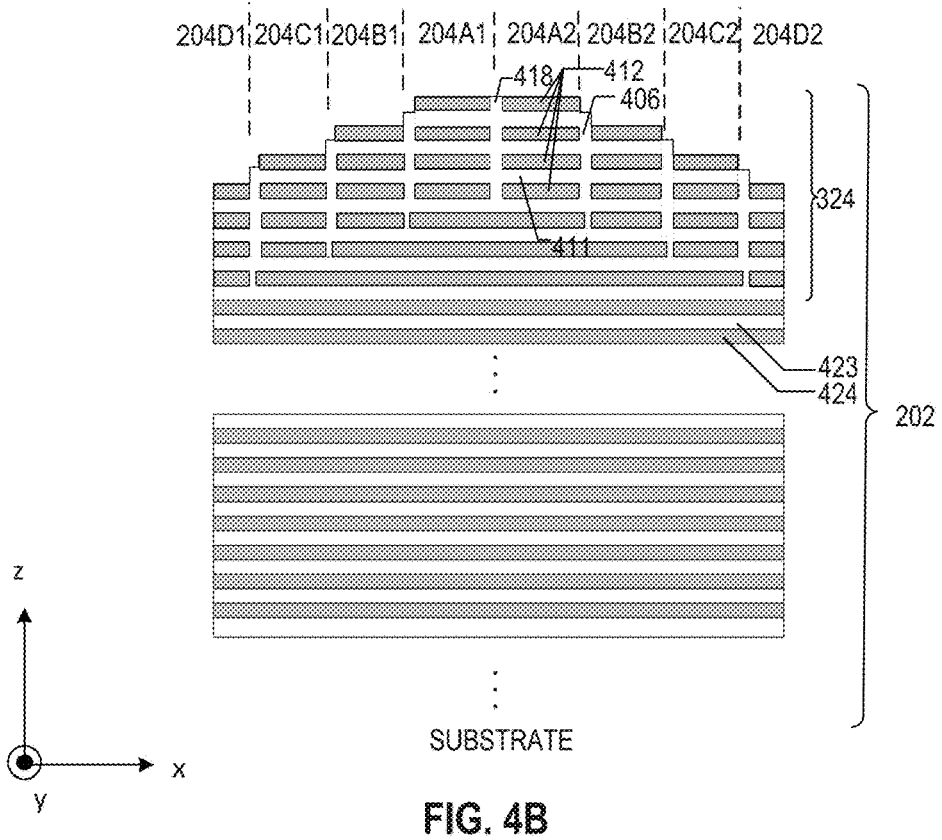
Figure 4C:
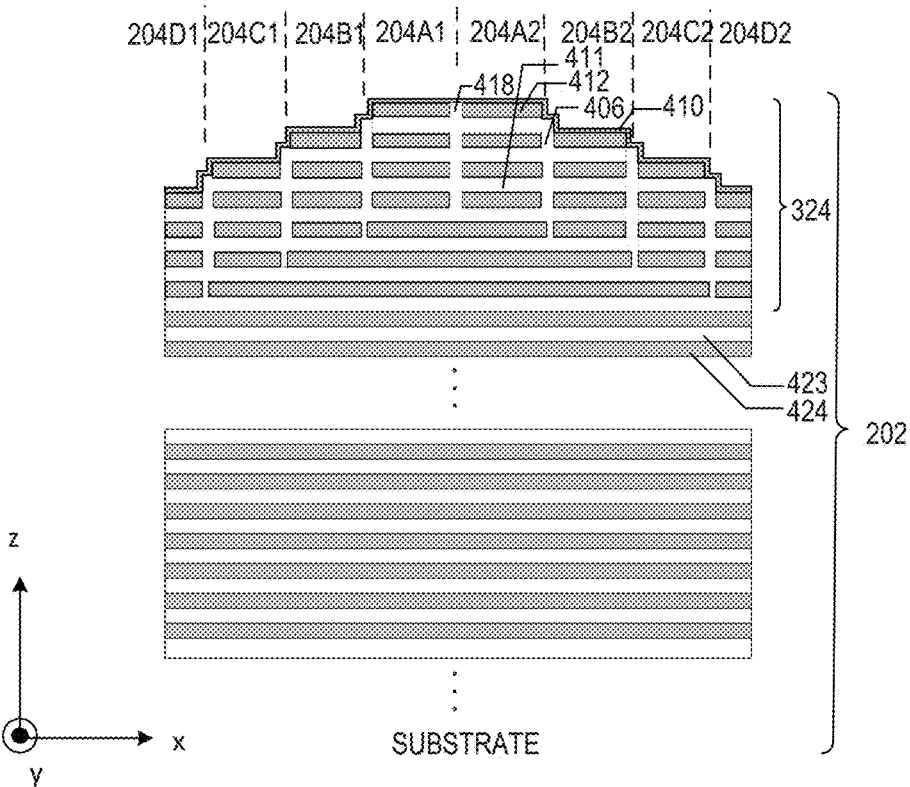
Figure 4D:
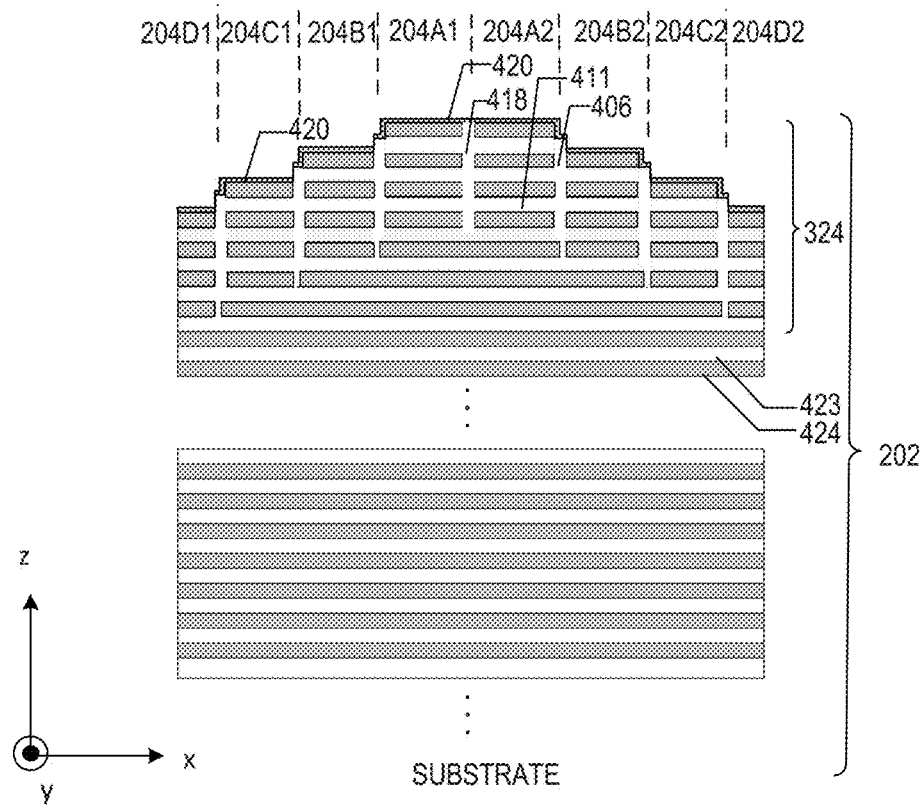
Figure 4E:
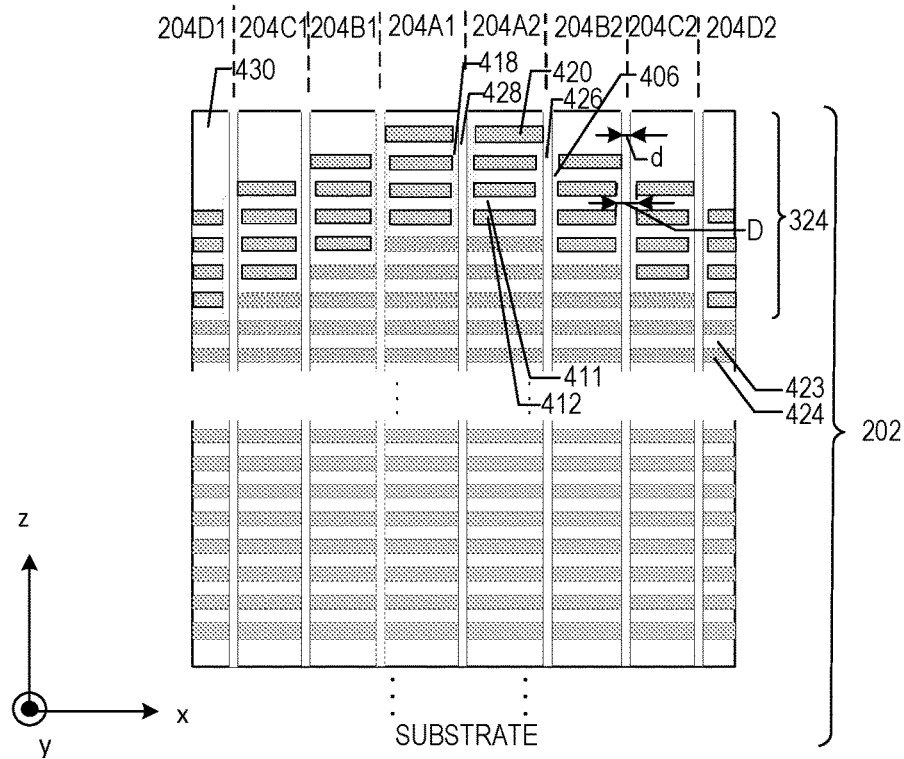
Figure 4F:
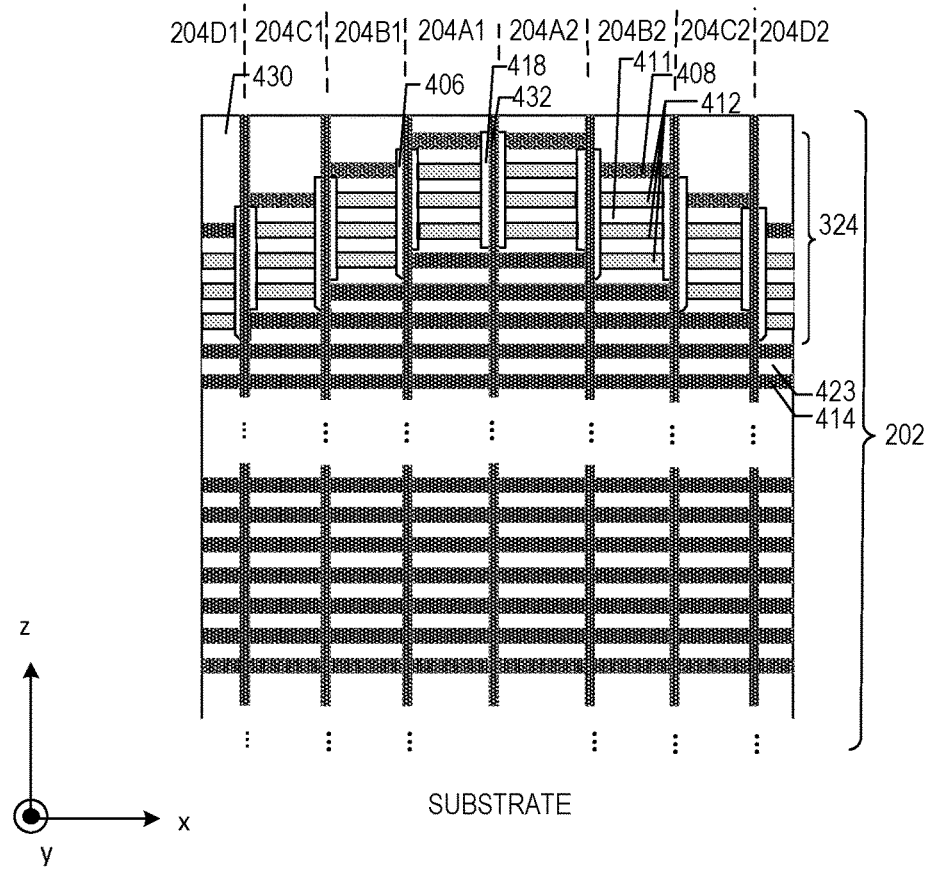
Figure 5:
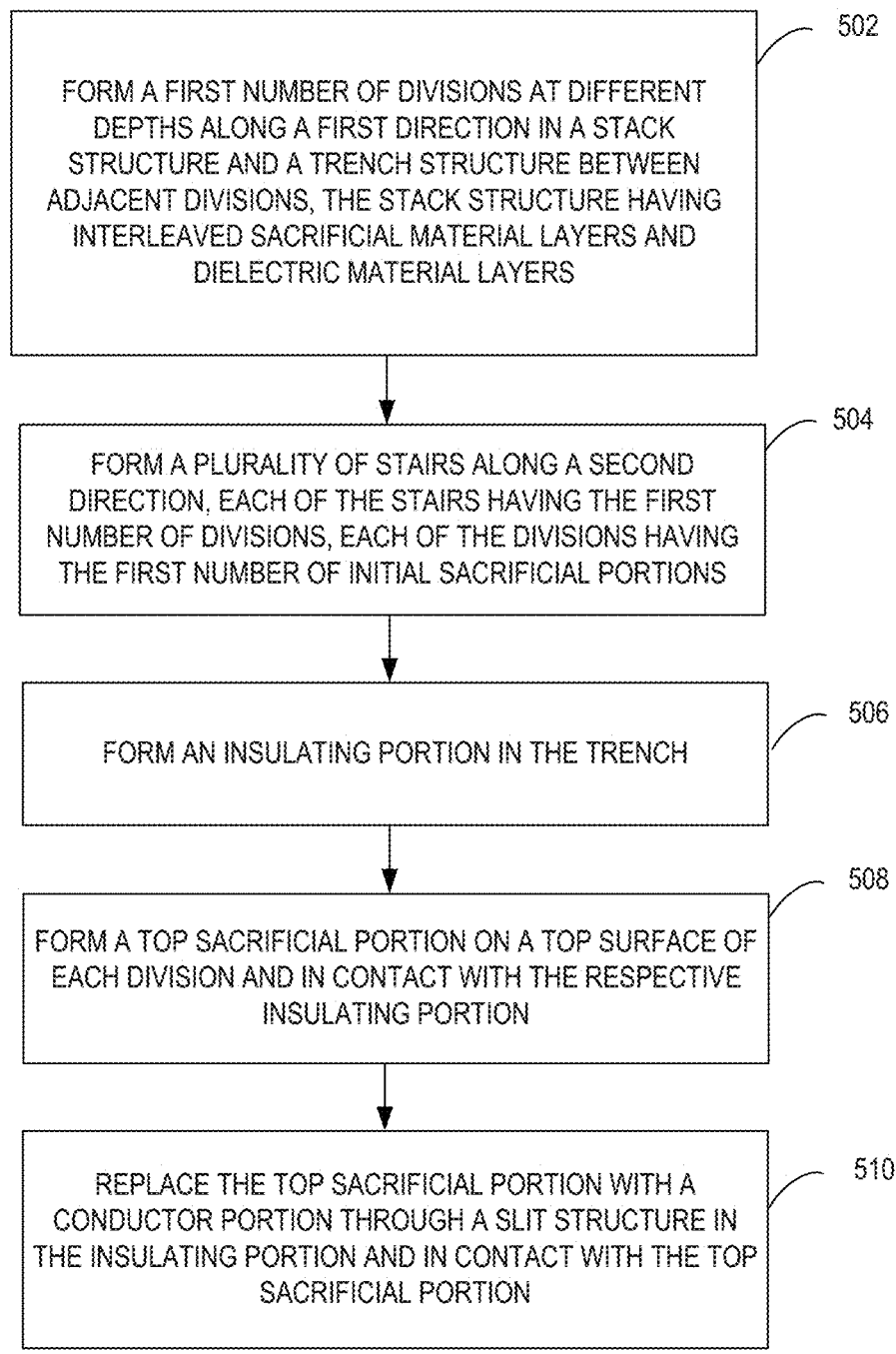
FIG. 5 illustrates a flowchart of a method for forming an exemplary 3D memory device, according to some embodiments.
Figure 6A:
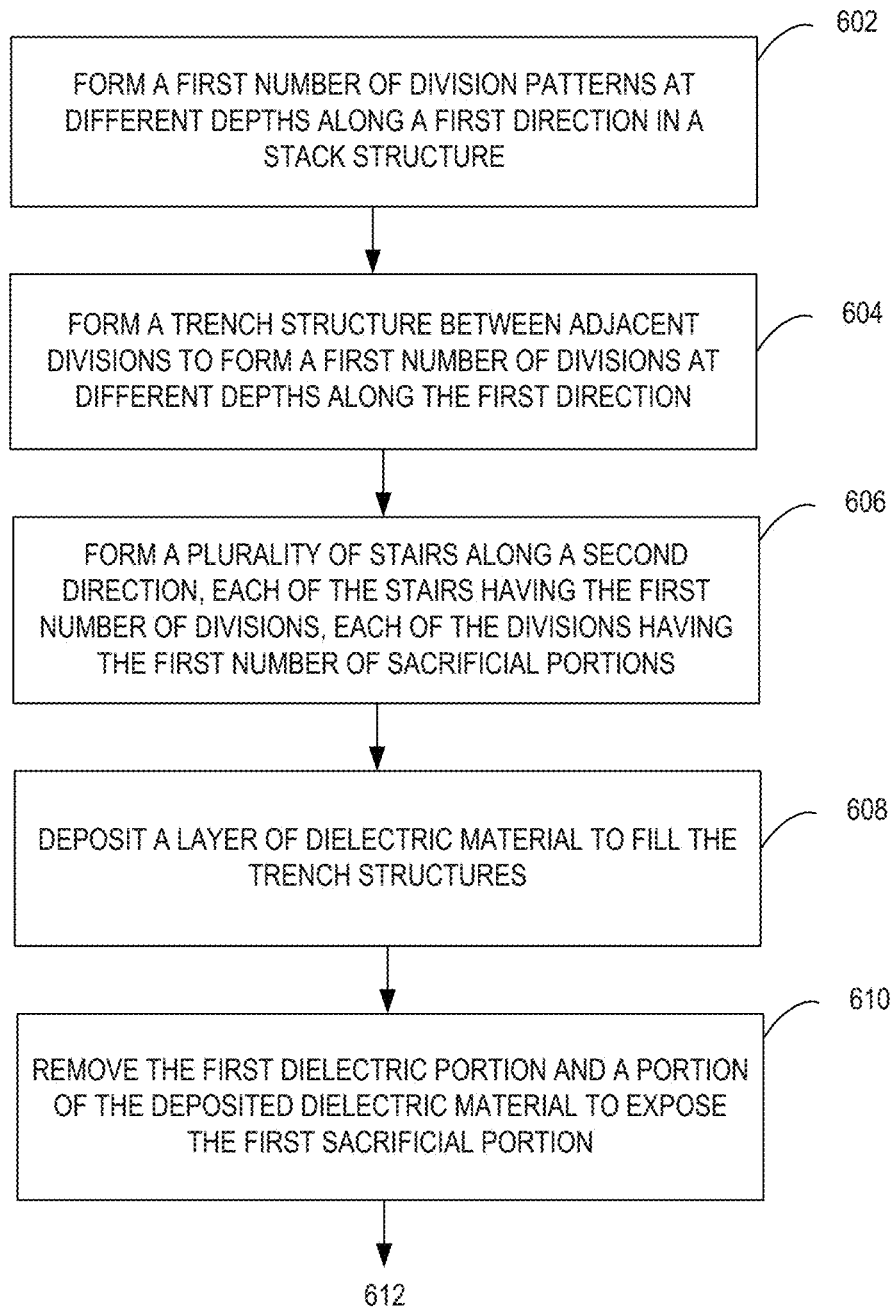
FIGS. 6A and 6B illustrate exemplary detailed fabrication operations of the method shown in FIG. 5, according to some embodiments.
Figure 6B:
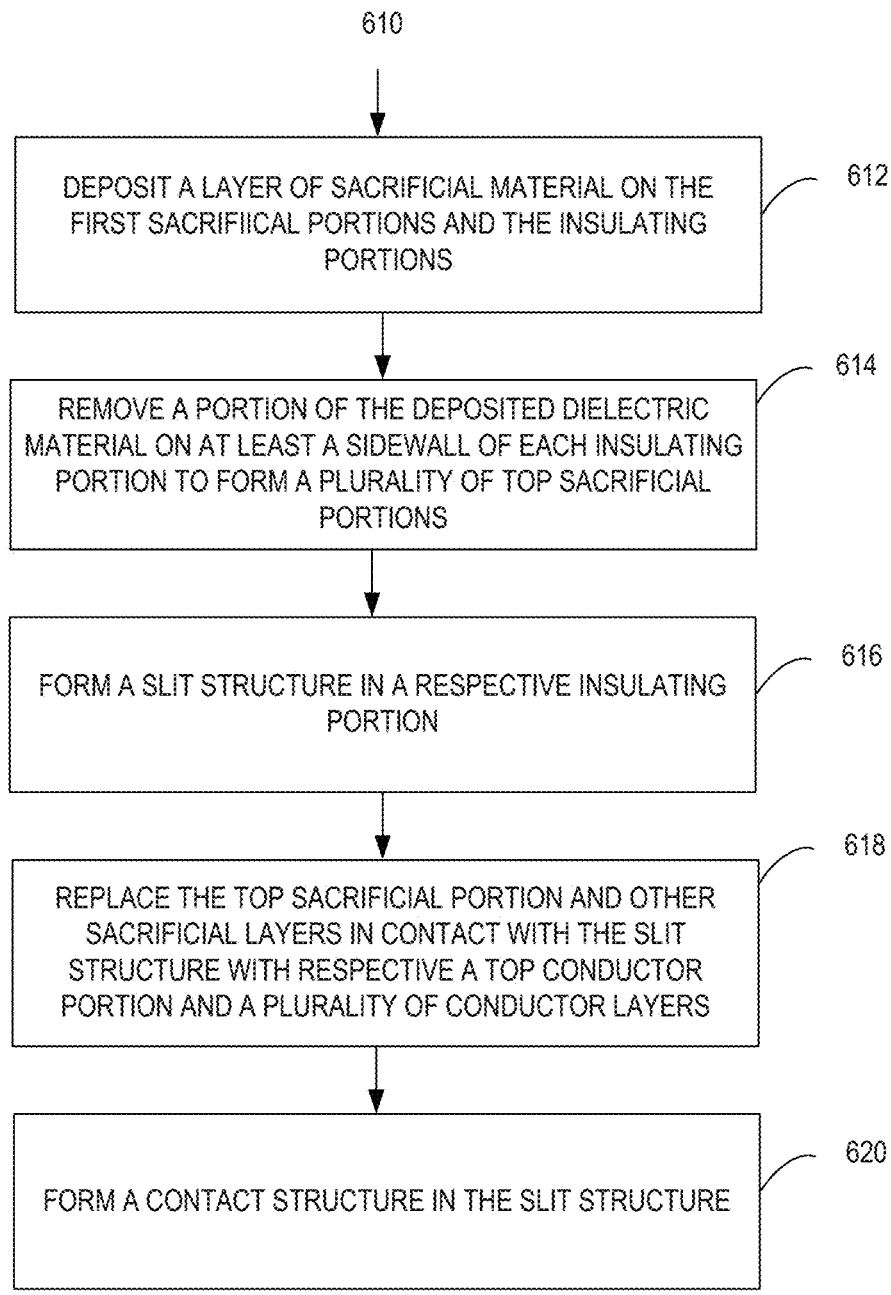

FIGS. 2A and 2B, 3A and 3B, and 4A-4F illustrate the structure of a staircase structure at different stages during an exemplary fabrication process, according to some embodiments. FIG. 5 illustrates a flow chart of the fabrication process shown in FIGS. 2A and 2B, 3A and 3B, and 4A-4F. FIGS. 6A and 6B illustrate detailed fabrication operations of the method shown in FIG. 5. FIG. 6B is a continuation of FIG. 6A. It is understood that the operations shown in method 500 are not exhaustive and that other operations can be performed as well before, after, or between any of the illustrated operations. Further, some of the operations may be performed simultaneously, or in a different order than those shown in FIGS. 5 and 6.

As shown in FIG. 5, at the beginning of the process, at Operation 502, in a stack structure, a first number of divisions at different depths along a first direction and a trench structure is formed between adjacent divisions are formed. The stack structure has interleaved sacrificial material layers and dielectric material layers is formed. FIGS. 2A, 2B, 3A, and 3B illustrate corresponding structures.

Figure 2A:
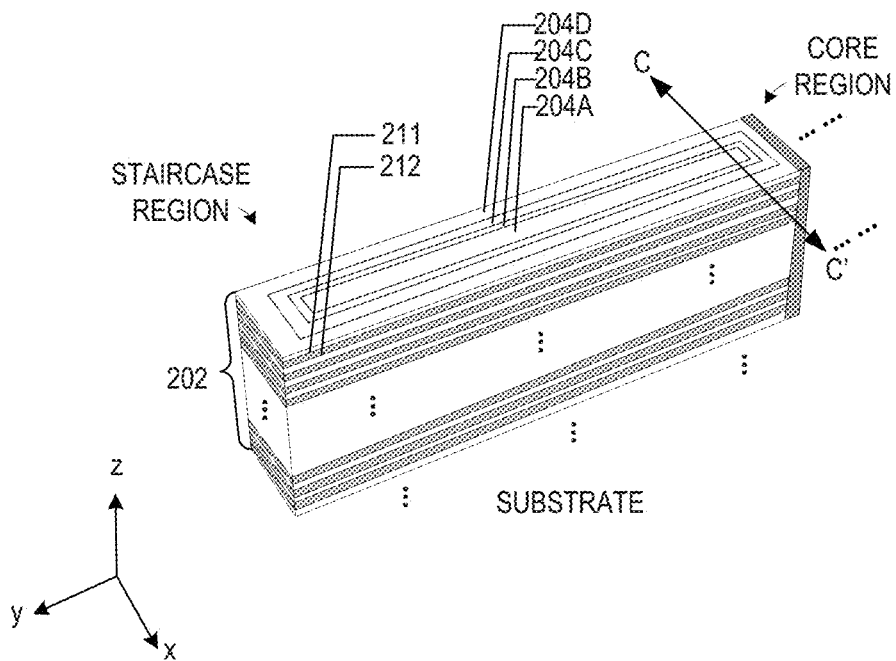
FIG. 2A illustrates a top front view of a 3D memory device having a four-division staircase structure in an exemplary fabrication process, according to some embodiments of the present disclosure.
Figure 2B:
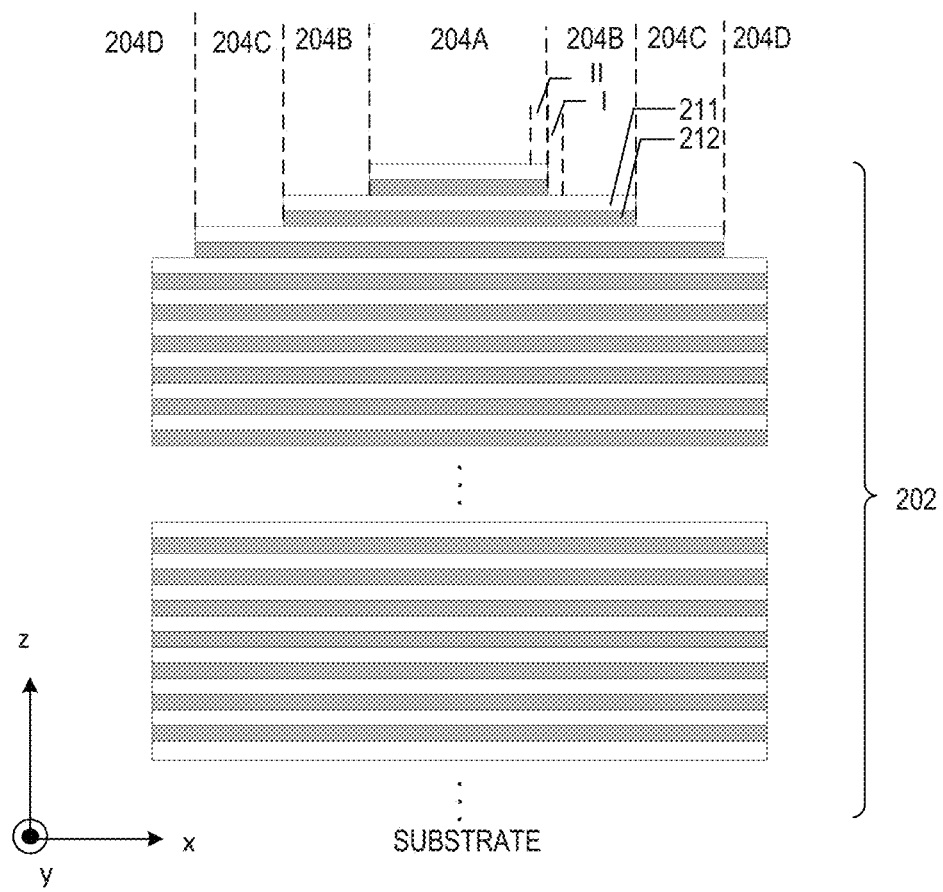
FIG. 2B illustrates a cross-sectional view of the 3D memory device shown in FIG. 2A, according to some embodiments of the present disclosure.

FIG. 2A illustrates a 3D overview of a stack structure 202, according to some embodiments. FIG. 2B illustrates a cross-sectional view of stack structure 202 along the C-C' direction (e.g., the x-z plane). As shown in FIG. 2A, stack structure 202 may be a dielectric stack and may include a plurality of dielectric material layers 211 and sacrificial material layers 212, arranged alternatingly along the z-axis. Dielectric material layers 211 and sacrificial material layers 212 may include different materials. Each dielectric material layer 211 and the underlying sacrificial material layer 212 can be referred to as a "dielectric pair", and vice versa. In some embodiments, dielectric material layers 211 and sacrificial material layers 212 are alternatingly deposited above a substrate (e.g., a silicon substrate). In some embodiments, each dielectric material layer 211 includes a layer of silicon oxide, and each sacrificial material layer includes a layer of silicon nitride. Stack structure 202 can be formed by one or more thin film deposition processes including, but not limited to, chemical vapor deposition (CVD), physical vapor deposition (PVD), atomic layer deposition (ALD), or any combination thereof.

According to Operation 602, a first number of division patterns are formed at different depths along a first direction in the stack structure. As shown in FIGS. 2A and 2B, a staircase division pattern (SDP) can be formed on stack structure 202. The SDP may divide stack structure 202 into four division patterns 204A, 204B, 204C, and 204D at different depths along the x-axis (e.g., the first direction). In each division pattern, dielectric material layer 211 may be over sacrificial material layer 212. The four division patterns 204A, 204B, 204C, and 204D can be formed by a plurality of cycles of trimming an etch mask laterally (e.g., along the x and y axes) and etching a part of stack structure 202 exposed by the etch mask. In some embodiments, three SDP masks are used to form the four division patterns. For example, a first SDP mask may cover a portion of stack structure 202 and expose the area corresponding to division pattern 204D. A suitable etching process (e.g., a first etching process), such as a dry etch and/or a wet etch, can be performed subsequently to remove a portion of stack structure 202 exposed by the first SDP mask. In some embodiments, the amount of materials removed by the etching process has a thickness of a stair depth, e.g., nominally equal to a dielectric pair (e.g., the total thickness of one dielectric material layer 211 and the underlying sacrificial material layer 212). A second SDP mask can be formed by trimming the first SDP mask inwardly and incrementally along the x-axis and the y-axis, to expose the area corresponding to division patterns 204D and 204C. A second etching process similar to the first etching process can be subsequently performed to remove a portion of (e.g., a stair depth of) stack structure 202 exposed by the second SDP mask. The etch pattern on stack structure 202, formed by the first etching process, can be transferred by the second etching process. A third SDP mask can be formed by trimming the second SDP mask inwardly and incrementally along the x-axis and the y-axis, to expose the area corresponding to division patterns 204D, 204C, and 204B. A third etching process similar to the first and second etching process can be subsequently performed to remove a portion of (e.g., a stair depth of) stack structure 202 exposed by the third SDP mask. The etch pattern on stack structure 202, formed by the first and second etching processes, can be transferred by the third etching process. In some embodiments, the shapes of the three SDP masks are nominally rectangular. In some embodiments, the three SDP masks may include hard etch masks and/or soft etch masks. The hard etch masks can be formed by patterning a hard material such as carbon using a patterned photoresist layer, formed by coating a photoresist layer followed by a photolithography process. The soft etch masks can include a patterned photoresist layer, formed by coating a photoresist layer followed by a photolithography process.

FIG. 3A illustrates a 3D overview of a stack structure 202, according to some embodiments. FIG. 3B illustrates a cross-sectional view of stack structure 202 along the C-C' direction (e.g., the x-z plane). According to Operation 604, a trench structure is formed between adjacent divisions to form a first number of divisions at different depths along the first direction. As shown in FIGS. 3A and 3B, a trench structure 306 is formed between adjacent divisions to divide division pattern 204A, 204B, 204C, and 204D into four divisions 204A1, 204B1, 204C1, and 204D1 of different depths on one side (e.g., along the x-axis) of stack structure 202, and four divisions 204A2, 204B2, 204C2, and 204D2 of different depths on the other side (e.g., along the x-axis) of stack structure. In some embodiments, trench structure 306 dividing division pattern 204A into divisions 204A1 and 204A2 is aligned with the middle line (e.g., along the x-axis) of stack structure 202, and divides stack structure 202 into nominally symmetrical portions along the x-axis.

Referring back to FIG. 2B, trench structure 306 can be formed between adjacent divisions, e.g., between adjacent division patterns and along the middle line (e.g., along the x-axis) of stack structure 202. In FIG. 2B, areas I and II may each represent an area in adjacent divisions/division patterns in which trench structure 306 can be formed. As an example shown in FIG. 2B, area I represents the area in division 204B2 or division pattern 204B, and area II represents the area in division 204A2 or division pattern 204A. The widths of areas I and II may each be at least the width of trench structure 306 along the x-axis. For example, the width of each of area I and II along the x-axis can each be in a range of about 200 nm to about 400 nm. In some embodiments, trench structure 306 is entirely formed in one of areas I and II. In some embodiments, trench structure 306 is partially formed in each of areas I and II. In some embodiments, trench structure 306 is formed by a suitable patterning process, e.g., a dry etch and/or a wet etch process.

As shown in FIG. 3A, trench structure 306 may be formed to extend laterally along the y-axis in stack structure 202. In some embodiments, along the y-axis, a length of trench structure 306 may be nominally equal to the length of stack structure 202. As shown in FIG. 3B, an etching profile of trench structure 306 may form four (e.g., the first number of) initial sacrificial layers 312, formed from the etching of initial sacrificial layers 312, in each adjacent division. The four initial sacrificial layers 312 may be exposed on the sidewall of trench structure 306. In some embodiments, in each division, each initial sacrificial layer 312 is sandwiched by an initial dielectric layer 311, which is formed from the etching of sacrificial material layers 212 and has nominally the same shape as the respective initial sacrificial layers 312 along the x and y axes. In some embodiments, when trench structure 306 is formed between two adjacent divisions at different depths (e.g., between divisions 204A2 and 204B2), the etching profile of trench structure 306 is asymmetric along the x-axis, as shown in FIG. 3B, to form four initial sacrificial layers 312 in each adjacent division. For example, the bottom surface of trench structure 306 can be shallower on the side of the higher division (e.g., division 204A2) to be in contact with initial dielectric layer 311 underlying the fourth (e.g., lowest) initial sacrificial layer 312 in division 204A2. Also, the bottom surface of trench structure 306 can be deeper on the side of the lower division (e.g., division 204B2) to be in contact with initial dielectric layer 311 underlying the fourth (e.g., lowest) initial sacrificial layer 312 in division 204B2. In some embodiments, for trench structure 306 between divisions at the same depth (e.g., trench structure 306 between divisions 204A1 and 204A2), the etching profile of trench structure 306 is nominally even on both sides of the divisions (e.g., 204A1 and 204A2) to form four initial sacrificial layers 312 in each division. In some embodiments, initial dielectric layer 311 under the fourth (e.g., lowest) initial sacrificial layer 312 of each division are partially etched or entirely etched along the z-axis. In some embodiments, along the x-axis, a width D of trench structure 306 is in a range of about 200 nm to about 400 nm.

Referring back to FIG. 5, after the formation of trench structures, method 500 proceeds to Operation 504, in which a plurality of stairs are formed along a second direction, each of the stairs having the first number of divisions, and each of the divisions having the first number of sacrificial portions.

According to Operation 606, a plurality of stairs extending along the y-axis (e.g., the second direction) can be formed in stack structure 202, referring back FIGS. 1A and 1C. Each of the stairs may include the first number of divisions, and each of the divisions includes the first number of sacrificial portions. The formation of the stairs may include repetitive etching of stack structure 202 using an etch mask (e.g., a patterned photoresist or PR layer) over stack structure 202. The etch mask can be repetitively trimmed inwardly and incrementally, often from all directions, to expose the portions of stack structure 202 to be etched. The amount of trimmed PR can be directly related (e.g., determinant) to the dimensions of the stairs. For example, the amount of trimmed PR along the y-axis may determine the length of a stair along the y-axis. The trimming of the PR layer can be obtained using a suitable etch, e.g., an isotropic dry etch such as a wet etch. One or more PR layers can be formed and trimmed consecutively for the formation of the stairs. In some embodiments, the etching of stack structure 202, e.g., using a suitable etching process such as dry etch and/or wet etch, follows the trimming of the PR layer. In some embodiments, stack structure 202 is etched by a second stair depth along the z-axis following each trimming of the PR layer. The second stair depth may be equal to the total thickness of four (e.g., the first number of) dielectric pairs (e.g., the top four initial dielectric/ sacrificial layer pairs) along the z-axis. The trimming process of a photoresist mask followed by the etching process of a stack structure is referred to herein as a trim-etch cycle. The number of trim-etch cycles can determine the number of stairs formed in stack structure 202 along the y-axis. In some embodiments, after the formation of stairs, dielectric material layers 211 may form sacrificial layers (e.g., 423 shown in FIG. 4A), and dielectric material layers may form dielectric layers (e.g., 424 shown in FIG. 4A).

In some embodiments, the etch profile of trench structures 306, formed before the formation of stairs, is transferred onto the formed staircase structure such that each stair includes four divisions 204A1-204D1 and other four divisions 204A2-204D2. Each of the two adjacent divisions are separated from each other by trench structure 306. In some embodiments, the etch profile of trench structure 306 remains nominally the same after the formation of the stairs.

For ease of illustration, in a respective stair, trench structure 306 may form four (e.g., the first number of) sacrificial portions (e.g., 412 in FIG. 4A) in each division. Each of the sacrificial portion may be sandwiched by a pair of dielectric portions (e.g., 411 in FIG. 4A). The lateral area of each sacrificial portion and each dielectric portion (e.g., along the x-y plane) may be determined by the dimension of the respective division along the x-axis and the dimension of the respective stair along the y-axis. Each sacrificial portion may be in contact with a sacrificial layer of the same level and extending laterally in stack structure 202, and each dielectric portion may be in contact with a dielectric layer of the same level and extending laterally in stack structure 202.

In various embodiments, Operation 502 can be performed before or after Operation 504. In some embodiments, the stairs are formed before the formation of divisions. For example, the plurality of stairs are formed along the y-axis prior to the formation of division patterns and divisions along the x-axis. The fabrication process of this order can be referred to the description above and is not repeated herein. The actual order to form the stairs and the divisions should be determined based on the fabrication process and not be limited by the embodiments of the present disclosure.

Referring back to FIG. 5, after the formation of stairs, method 500 proceeds to Operation 506, in which an insulating portion is formed in each trench. FIGS. 4A and 4B illustrate a corresponding structure.

According to Operation 608, a layer of dielectric material is deposited to fill the trench structures. As shown in FIGS. 4A and 4B, a layer 404 of dielectric material may be deposited to fill in trench structures 306. The dielectric material may also be on the first dielectric portion 411 at the top surface of each division. According to Operation 610, the first dielectric portion and the deposited dielectric material are removed to expose the first sacrificial portion in each division. In some embodiments, after trench structures 306 are filled with the dielectric material, a suitable etching process is performed to remove dielectric portion 411 in each division and any dielectric material on dielectric portion 411, to expose the first sacrificial portion 412 in each division of a stair 324. In some embodiments, a top surface and a side surface of sacrificial portion 412 are exposed in each division of stair 324. In some embodiments, the side surface of sacrificial portion 412 refers to the side surface facing away from the middle line of the stair 324. Insulating portions 406 and 418 can be formed between adjacent divisions. In some embodiments, for insulating portions 406 that are each located between two adjacent divisions of different depths, a top surface of insulating portion 406 is above the top surface of sacrificial portion 412 in a lower division and below the top surface of sacrificial portion 412 in a higher division. That is, the top surface of insulating portion 406 is between the top surfaces of respective adjacent divisions. In some embodiments, for insulating portion 418 located between two adjacent divisions of nominally the same depth, a top surface of insulating portion 418 is nominally coplanar with sacrificial portions 412 in adjacent divisions. In some embodiments, stack structure 202 includes a plurality of interleaved sacrificial layers 424 and dielectric layers 423 under stair 324. Sacrificial layers 424 may be in contact with sacrificial portions in lower stairs, and dielectric layers 423 may be in contact with dielectric portions in lower stairs.

In some embodiments, the dielectric material includes any suitable dielectric materials such as silicon oxide. In some embodiments, the deposition of silicon oxide includes, but not limited to, CVD, PVD, and ALD. In some embodiments, the removal of the dielectric material includes a suitable etching process such as dry etch and/or wet etch.

Referring back to 5, after the formation of insulating portions, method 500 proceeds to Operation 508, in which a top sacrificial portion is formed on the top surface of each division and in contact with the respective insulating portion. FIGS. 4C and 4D illustrate corresponding structures.

According to Operation 612, a layer of sacrificial material is deposited on the first sacrificial portions and the insulating portions. As shown in FIG. 4C, a layer 410 of sacrificial material can be deposited on at least the exposed first sacrificial portions 412 in stack structure 202. Layer 410 may also be in contact with (e.g., cover) the exposed side surface of the first sacrificial portion 412 and the top surface of each insulating portion 406 such that each insulating portion 406 can be connected to the first sacrificial portion of the adjacent higher division through the sacrificial material. According to Operation 614, a portion of the deposited dielectric material on at least a sidewall of each insulating portion is removed to form a plurality of top sacrificial portions. As shown in FIG. 4D, a portion of layer 410 on the sidewall of each insulating portion 106 may be removed to disconnect the deposited sacrificial material between adjacent divisions. In some embodiments, in stair 324, a portion of layer 410 partially or fully covers the top and side surfaces of the first sacrificial portion 412 of each division and the top surface of the respective insulating portion 106, which is positioned between the respective division and a lower division. For example, the portion of layer 410 may partially or fully cover the top and side surfaces of first sacrificial portion 412 of division 204B2 and the top surface of insulating portion 406 between divisions 204B2 and 204C2. In some embodiments, a portion of layer 410 on the top surface of stack structure 202 (or stair 324) is removed. In some embodiments, insulating portion 418 is exposed on the top surface of stack structure 202 (e.g., between divisions 204A1 and 204A2).

Each portion of layer 410 and the underlying first sacrificial portion 412 may be referred to as a top sacrificial portion 420, at the top surface of each division of stair 324. In some embodiments, because a width of the top sacrificial portion 420, along the x-axis, includes the width of first sacrificial portion 412 and at least a part of the width of insulating portion 106, the width of the sacrificial portion 420 is greater than widths of the underlying sacrificial portions 412. In some embodiments, in stair 324, top sacrificial portions 420 of each division (e.g., 204A1-D1, 204A2-D2) are separated from one another.

In some embodiments, the sacrificial material includes a dielectric material the same as sacrificial material layers 212, such as silicon nitride. In some embodiments, the deposition of silicon nitride includes, but not limited to, CVD, PVD, and ALD. In some embodiments, the removal of the sacrificial material includes a suitable etching process such as dry etch and/or wet etch.

Referring back to FIG. 5, after the formation of top sacrificial portions, method 500 proceeds to Operation 510, in which the top sacrificial portion is replaced with a conductor portion through a list structure in the insulating portion and in contact with the top sacrificial portion. FIGS. 4E and 4F illustrate corresponding structures.

According to Operation 616, a slit structure is formed in a respective insulating portion. As shown in FIG. 4E, a plurality of slit structures 426 and 428 are formed in stack structure 202, each extending vertically in the respective insulating portion and laterally along the y-axis. In some embodiments, slit structures 426 and 428 may extend into the substrate. In some embodiments, slit structure 426 is formed in insulating portion 406, and slit structure 428 is formed insulating portion 418. A width d of each of slit structures 426 and 428 may be in a range of about 120 nm to about 160 nm, less than width D of insulating portions 406 and 418, which is in a range of about 200 nm to about 400 nm. Thus, each slit structure 426 may be in contact with top sacrificial portion 420 in a higher adjacent division of stair 324 and have no contact with the three sacrificial portions 412 underlying top sacrificial portion 420. In some embodiments, slit structure 426 is in contact with the sacrificial material over the respective insulating portion 406. In some embodiments, slit structure 426 may be in contact with sacrificial layers 424 under sacrificial portions 412 of adjacent divisions and sacrificial layers 424 in contact with top sacrificial portion 420 and sacrificial portions 412 on the same levels. In some embodiments, slit structure 418 has no contact with sacrificial portions 412 and top sacrificial portions 420 in adjacent divisions, and is in contact with sacrificial layers 424 under sacrificial portions 412 of adjacent divisions and sacrificial layers 424 in contact with top sacrificial portion 420 and sacrificial portions 412 on the same levels. In some embodiments, an insulating structure 430 is formed to surround stack structure 202 such that stack structure 202 is in insulating structure 430. In some embodiments, insulating structure 430 is formed prior to the formation of slit structures 426.

In some embodiments, slit structures 426 and 428 are formed by any suitable patterning process, e.g., a dry etch and/or a wet etch. In some embodiments, insulating structure 430 includes silicon oxide and is deposited by one or more of CVD, PVD, and ALD.

According to Operation 618, the top sacrificial portion and other sacrificial layers in contact with the slit structure are replaced with a respective top conductor portion and a plurality of conductor layers. As shown in FIG. 4F, a conductor portion 408 may be formed at the top surface of each division in stair 324. In some embodiments, sacrificial layers 424 in contact with a slit structure, e.g., 426 or 428, are replaced with a conductor layer 414. In some embodiments, a suitable isotropic etching process, e.g., a wet etch, is performed through slit structures 426 and 428 to remove the sacrificial materials in top sacrificial portions 420 and any sacrificial layers 424 that are in contact with slit structures 426 and 428 to form a plurality of lateral recesses. In some embodiments, a top lateral recess is formed in each division as a result of the removal of top sacrificial portion 420. A suitable conductor material, such as tungsten, can be deposited into the lateral recesses by a deposition process that includes, but not limited to, CVD, ALD, and PVD. Conductor portion 408 may be formed in each division. A plurality of conductor layers 414 under each division and a second number of (e.g., three) conductor layers 414 may be formed in contact with the second number of sacrificial portions 412. Because the second number of sacrificial portions 412 have no contact with slit structures 426 and 428, the sacrificial material in sacrificial portions 412 is retained after the etching and the gate-replacement process. The three sacrificial portions 412 and the respective underlying dielectric portions 411 may form a non-conductor structure (e.g., 114 in FIG. 1C) under the respective conductor portion 408 in each division. Each sacrificial portion 412 may be referred to as a non-conductor portion.

According to Operation 620, a contact structure is formed in the slit structure. In some embodiments, a contact structure 432 is formed in each slit structure. Except for contact structure 432 between divisions 204A1 and 204A2, each contact structure 432 is in contact with conductor portion 408 in a higher adjacent division. For example, contact structure 432 between divisions 204A2 and 204B2 is in contact with conductor portion 408 of division 204A2. In some embodiments, contact structure 432 between divisions 204A1 and 204A2 is not in contact with conductor portions 408 of adjacent divisions (e.g., divisions 204A1 and 204A2). In some embodiments, contact structure 432 is also in contact with a plurality of conductor layers 414 under adjacent divisions, and a second number of (e.g., three) conductor layers in contact with the second number of sacrificial portions 412 (or the non-conductor portions) in each adjacent divisions.

In some embodiments, contact structure 432 includes an insulating spacer and a contact in the insulating spacer. The insulating spacer may include silicon oxide and can be formed by at least one of ALD, CVD, and PVD. The contact may include tungsten and can be formed by at least one of ALD, CVD, and PVD. In some embodiments, contact structure 432 also includes a doped region in the substrate and in contact with the contact. The doped region can be formed prior to the formation of the contact and can be formed by a suitable doping process such as ion implantation.

According to embodiments of the present disclosure, a memory device includes a memory array structure and a staircase structure. The staircase structure includes a plurality of stairs each has a first number of divisions at different depths along a first direction. The plurality of stairs extend along a second direction perpendicular to the first direction. Each of the first number of divisions of a respective stair includes a conductor portion on the top surface of the respective division and a second number of non-conductor portions under the conductor portion. The conductor portion and the non-conductor portions are insulated from one another by one or more dielectric layers.

In some embodiments, in each of the first number of divisions, a length of each of the second number of non-conductor portions along the second direction is the same as a length of the respective stair along the second direction.

In some embodiments, the memory device further includes an insulating portion between adjacent divisions. A length of the insulating portion along the second direction is the same as the length of the respective stair, and a depth of the insulating portion along a vertical direction is about a thickness of the respective stair.

In some embodiments, the memory device further includes a contact structure extending in the insulating portion between the adjacent divisions. Along the first direction, a width of the insulating portion is greater than a width of the contact structure such that the contact structure is separated from the second number of non-conductor portions in the adjacent divisions.

In some embodiments, the width of the insulating portion along the first direction is in a range of about 200 nm to about 400 nm.

In some embodiments, the second number is equal to the first number minus one.

In some embodiments, each of the first number of divisions further includes one or more conductor layers under the second number of non-conductor portions and extending along the second direction.

In some embodiments, each of the first number of divisions further includes a second number of conductor layers respectively in contact with the second number of non-conductor portions and extending along the second direction.

In some embodiments, the contact structure is in contact with (i) the conductor portion in a higher adjacent division, (ii) the one or more conductor layers under the second number of non-conductor portions, and (iii) the second number of conductor layers in contact with the second number of non-conductor portions. In some embodiments, the contact structure is isolated from the non-conductor portions in adjacent divisions.

In some embodiments, the memory device further includes, in the respective stair, another first number of divisions arranged symmetrically of the first number of divisions about a middle line of the stair; another insulating portion extending vertically along the middle line of the stair; and another contact structure extending in the other insulating portion. The other contact structure is separated from the conductor portion and the second number of non-conductor portions in each of the adjacent divisions.

According to embodiments, a memory device includes a memory array structure and a staircase structure. The staircase structure includes a plurality of stairs each includes a first number of divisions at different depths along a first direction, the plurality of stairs extending along a second direction perpendicular to the first direction. The staircase structure also includes an insulating portion between adjacent divisions. A depth of the insulating portion along a vertical direction is about a thickness of the respective stair. Of the insulation portion, a portion of a bottom surface in a lower adjacent division is lower than a portion of the bottom surface in a higher adjacent division.

In some embodiments, a length of the insulating portion along the second direction is the same as the length of the respective stair.

In some embodiments, each of the first number of divisions of a respective stair includes a conductor portion on the top surface of the respective division and a second number of non-conductor portions under the conductor portion. The conductor portion and the non-conductor portions may be insulated from one another by one or more dielectric layers.

In some embodiments, in each of the first number of divisions, a length of each of the second number of non-conductor portions along the second direction is the same as a length of the respective stair along the second direction.

In some embodiments, the memory device further includes a contact structure extending in the insulating portion between the adjacent divisions. Along the first direction, a width of the insulating portion is greater than a width of the contact structure such that the contact structure is separated from the second number of non-conductor portions in the adjacent divisions.

In some embodiments, the width of the insulating portion along the first direction is in a range of about 200 nm to about 400 nm.

In some embodiments, the second number is equal to the first number minus one.

In some embodiments, each of the first number of divisions further includes one or more conductor layers under the second number of non-conductor portions and extending along the second direction.

In some embodiments, each of the first number of divisions further includes a second number of conductor layers respectively in contact with the second number of non-conductor portions and extending along the second direction.

In some embodiments, the contact structure is in contact with (i) the conductor portion in a higher adjacent division, (ii) the one or more conductor layers under the second number of non-conductor portions, and (iii) the second number of conductor layers in contact with the second number of non-conductor portions. In some embodiments, the contact structure is isolated from the non-conductor portions in adjacent divisions.

In some embodiments, the memory device further includes, in the respective stair, another first number of divisions arranged symmetrically of the first number of divisions about a middle line of the stair, another insulating portion extending vertically along the middle line of the stair; and another contact structure extending in the other insulating portion, wherein the other contact structure is separated from the conductor portion and the second number of non-conductor portions in each of the adjacent divisions.

According to the embodiments of the present disclosure, a method for forming a staircase structure of a memory device includes the following operations. First, a first number of divisions are formed at different depths along a first direction in a stack structure and a trench structure between adjacent divisions, the stack structure having interleaved sacrificial material layers and dielectric material layers. A plurality of stairs are formed along a second direction. Each of the plurality of stairs includes the first number of divisions, and each of the divisions includes a first number of sacrificial portions. The second direction is perpendicular to the first direction. An insulating portion is formed in the trench structure. A top sacrificial portion is formed on a top surface of each of the first number of divisions and in contact with the insulating portion. The top sacrificial portion is replaced with a conductor portion through a slit structure in the insulating portion and in contact with the top sacrificial portion.

In some embodiments, forming the first number of divisions and the trench structure includes repetitively patterning the stack structure to form a plurality of division patterns of different depths along the first direction. Each division pattern includes an initial dielectric layer over an initial sacrificial layer at a respective top surface. Forming the first number of divisions and the trench structure also includes removing a portion of the stack structure between adjacent division patterns.

In some embodiments, along the first direction, a width of the trench structure is greater than a width of the slit structure. In some embodiments, along the second direction, a length of the trench structure is the same as the respective stair. In some embodiments, along a vertical direction, the trench structure forms a first number of initial sacrificial layers in each of the adjacent divisions.

In some embodiments, the portion of the stack structure includes a portion of at least one of the adjacent divisions.

In some embodiments, each of the first number of sacrificial portions is sandwiched by a pair of dielectric portions.

In some embodiments, the first number of divisions are formed prior to the plurality of stairs.

In some embodiments, forming the insulating portion includes depositing a layer of dielectric material to fill up the trench structure, and removing the first dielectric portion and a portion of the dielectric material to expose a top surface and a side surface of a first sacrificial portion. A top surface of the insulating portion is between top surfaces of adjacent first sacrificial portions.

In some embodiments, forming the top sacrificial portion, in each division, includes depositing a layer of sacrificial material over the first sacrificial portion and the insulating portion and removing a portion of the sacrificial material to expose a side surface of the insulating portion such that the top sacrificial portion is in contact with the insulating portion on a top surface of the insulating portion and is disconnected from adjacent sacrificial portions.

In some embodiments, depositing the sacrificial material includes depositing the same material as the first sacrificial portion.

In some embodiments, the method further includes forming the slit structure in the insulating portion and in contact with the top sacrificial portion. Replacing the top sacrificial portion with a conductor portion through the slit structure includes replacing the top sacrificial portion with a conductor portion through the slit structure.

In some embodiments, forming the slit structure includes removing a portion of the insulating portion and a portion of the stack structure between the adjacent divisions such that the slit structure is (i) in contact with the respective top sacrificial portion, and (ii) isolated from a second number of sacrificial portions in the adjacent divisions, the second number being the first number minus one.

In some embodiments, the slit structure is further (i) in contact with one or more sacrificial layers below the second number of sacrificial portions, and (ii) in contact with the second number of sacrificial layers in contact with the sacrificial portions in each division.

In some embodiments, replacing the respective top sacrificial portion in contact with the slit structure with a conductor portion includes removing, in each division, the top sacrificial portion through the slit structure to form a top lateral recess, and depositing a conductor material to fill up the top lateral recess through the slit structure.

In some embodiments, the method further includes removing, in each division, the second number of and the one or more sacrificial layers to form a plurality of lateral recesses through the slit structure, in the same process that form the top lateral recess. In some embodiments, the method further includes depositing the conductor material to fill up the plurality of lateral recesses through the slit structure.

In some embodiments, the method further includes forming a contact structure in the slit structure.

In some embodiments, forming the contact structure includes depositing an insulating spacer in the slit structure and depositing a conductive material in the insulating spacer to fill up the slit structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a staircase structure of a memory device, comprising:
    forming a first number of divisions at different depths along a first direction in a stack structure and a trench structure between adjacent divisions, the stack structure comprising interleaved sacrificial material layers and dielectric material layers;
    forming a plurality of stairs along a second direction, wherein each of the plurality of stairs comprises the first number of divisions, and each of the divisions comprises a first number of sacrificial portions, the second direction being perpendicular to the first direction;
    forming an insulating portion in the trench structure;
    forming a top sacrificial portion on a top surface of each of the first number of divisions and in contact with the insulating portion; and
    replacing the top sacrificial portion with a conductor portion through a slit structure in the insulating portion and in contact with the top sacrificial portion.

2. The method of claim 1, wherein forming the first number of divisions and the trench structure comprises:
    repetitively patterning the stack structure to form a plurality of division patterns of different depths along the first direction, each division pattern comprising an initial dielectric layer over an initial sacrificial layer at a respective top surface; and
    removing a portion of the stack structure between adjacent division patterns.

3. The method of claim 2, wherein
    along the first direction, a width of the trench structure is greater than a width of the slit structure;
    along the second direction, a length of the trench structure is the same as the respective stair; and
    along a vertical direction, the trench structure forms a first number of initial sacrificial layers in each of the adjacent divisions.

4. The method of claim 2, wherein the portion of the stack structure comprises a portion of at least one of the adjacent divisions.

5. The method of claim 1, wherein each of the first number of sacrificial portions is sandwiched by a pair of dielectric portions.

6. The method of claim 1, wherein the first number of divisions are formed prior to the plurality of stairs.

7. The method of claim 4, wherein forming the insulating portion comprises:
    depositing a layer of dielectric material to fill up the trench structure; and
    removing the first dielectric portion and a portion of the dielectric material to expose a top surface and a side surface of a first sacrificial portion, a top surface of the insulating portion being between top surfaces of adjacent first sacrificial portions.

8. The method of claim 7, wherein forming the top sacrificial portion, in each division, comprises:
    depositing a layer of sacrificial material over the first sacrificial portion and the insulating portion; and
    removing a portion of the sacrificial material to expose a side surface of the insulating portion such that the top sacrificial portion is in contact with the insulating portion on a top surface of the insulating portion and is disconnected from adjacent sacrificial portions.

9. The method of claim 8, wherein depositing the sacrificial material comprises depositing the same material as the first sacrificial portion.

10. The method of claim 1, further comprising forming the slit structure in the insulating portion and in contact with the top sacrificial portion, and wherein replacing the top sacrificial portion with a conductor portion through the slit structure comprises replacing the top sacrificial portion with a conductor portion through the slit structure.

11. The method of claim 10, wherein forming the slit structure comprises removing a portion of the insulating portion and a portion of the stack structure between the adjacent divisions such that the slit structure is (i) in contact with the respective top sacrificial portion, and (ii) isolated from a second number of sacrificial portions in the adjacent divisions, the second number being the first number minus one.

12. The method of claim 11, wherein the slit structure is further (i) in contact with one or more sacrificial layers below the second number of sacrificial portions, and (ii) in contact with the second number of sacrificial layers in contact with the sacrificial portions in each division.

13. The method of claim 12, wherein replacing the respective top sacrificial portion in contact with the slit structure with a conductor portion comprises:
    removing, in each division, the top sacrificial portion through the slit structure to form a top lateral recess; and
    depositing a conductor material to fill up the top lateral recess through the slit structure.

14. The method of claim 13, further comprising:
    removing, in each division, the second number of and the one or more sacrificial layers to form a plurality of lateral recesses through the slit structure, in the same process that form the top lateral recess; and
    depositing the conductor material to fill up the plurality of lateral recesses through the slit structure.

15. The method of claim 12, further comprising forming a contact structure in the slit structure.

16. The method of claim 13, wherein forming the contact structure comprises:
    depositing an insulating spacer in the slit structure; and
    depositing a conductive material in the insulating spacer to fill up the slit structure.

* * * * *